(12) United States Patent
Seeley et al.

(10) Patent No.: US 7,030,366 B2
(45) Date of Patent: Apr. 18, 2006

(54) MICRO PIEZO-OPTIC COMPOSITE TRANSDUCERS AND FABRICATION METHODS

(75) Inventors: Charles Erklin Seeley, Niskayuna, NY (US); Matthew Christian Nielsen, Scotia, NY (US); Glen Peter Koste, Niskayuna, NY (US)

(73) Assignee: General Electric Company, Niskayuna, NY (US)

( * ) Notice: Subject to any disclaimer, the term of this patent is extended or adjusted under 35 U.S.C. 154(b) by 72 days.

(21) Appl. No.: 10/847,953

(22) Filed: May 13, 2004

(65) Prior Publication Data

US 2005/0253050 A1     Nov. 17, 2005

(51) Int. Cl.
*G01J 1/04* (2006.01)
*G01J 4/00* (2006.01)

(52) U.S. Cl. ............... 250/227.14; 250/227.18; 250/227.28; 356/32; 385/13

(58) Field of Classification Search ...............
250/227.14–227.18, 227.28, 237 G; 356/32; 310/311, 328, 367; 385/12, 13
See application file for complete search history.

(56) References Cited

U.S. PATENT DOCUMENTS

| | | | |
|---|---|---|---|
| 4,412,148 A | 10/1983 | Klicker et al. | |
| 5,380,995 A | 1/1995 | Udd et al. | |
| 5,399,854 A * | 3/1995 | Dunphy et al. | 250/227.17 |
| 5,808,779 A * | 9/1998 | Weis | 359/290 |
| 5,869,189 A | 2/1999 | Hagood, IV et al. | |
| 6,048,622 A | 4/2000 | Hagood, IV et al. | |
| 6,330,383 B1 * | 12/2001 | Cai et al. | 385/37 |
| 6,337,737 B1 * | 1/2002 | Chang et al. | 356/32 |
| 6,629,341 B1 | 10/2003 | Wilkie et al. | |
| 6,807,853 B1 * | 10/2004 | Adamson et al. | 73/146 |

FOREIGN PATENT DOCUMENTS

GB     2328278 A     2/1999

OTHER PUBLICATIONS

Y. Ning, et al "Interrogation of a Conventional Current Transformer by a Fiber-optic Interferometer", Optics Letters, vol. 16, No. 18, Sep. 15, 1991, pp. 1448-1450.
N. Fisher, et al "The Interrogation of a Conventional Current Transformer Using an In-Fibre Bragg Grating", Meas. Sci. Technol. ,8 (1997), pp. 1080-1084.

* cited by examiner

*Primary Examiner*—Stephone B. Allen
*Assistant Examiner*—Davienne Monbleau
(74) *Attorney, Agent, or Firm*—Ann M. Agosti; Patrick K. Patnode

(57) ABSTRACT

A micro piezo-optic composite transducer comprises: dielectric material; electrodes situated over opposing surfaces of the dielectric material; an optical fiber embedded in the dielectric material, the optical fiber configured to have a wavelength response as a function of material strain; and piezoelectric fibers embedded in the dielectric material and situated on opposing sides of the optical fiber.

35 Claims, 5 Drawing Sheets

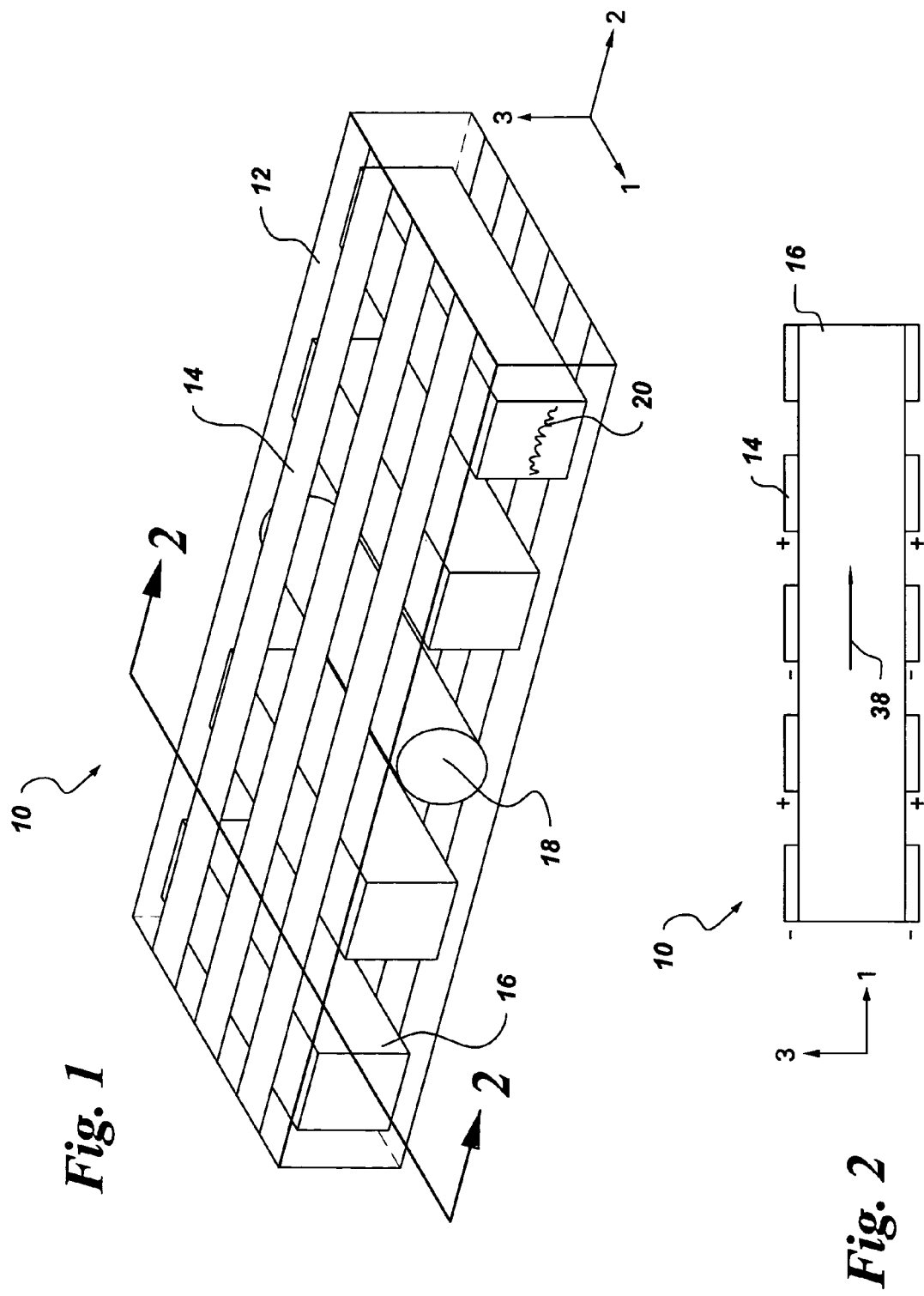

MICRO PIEZO-OPTIC COMPOSITE TRANSDUCERS AND FABRICATION METHODS

BACKGROUND

The invention relates generally to transducers.

Structures used in aerospace applications such as aircraft components typically have integrated sensors and actuators. The actuators are used to drive electric valves, pumps, jacks, and other devices used in normal aircraft operation. Additional electronic devices may be used for avionics, surveillance, jamming, communication, or other functions. Each of these electronic devices typically has at least one current or voltage sensor. Such sensors can monitor the power consumption and indicate if there is a problem or failure of a particular device. Many motor drives for actuation on avionic or other applications include closed loop control embodiments that depend upon sensing current, voltage, or a combination of current and voltage.

In conventional aircraft systems, the output of the current and voltage sensors is linked to a flight control computer or other control electronics equipment through a wire harness with each one wire being connected to one respective sensor. In some aircraft systems, hundreds of sensors have hundreds of wires that link them to the data acquisition system. The wire harnesses have evolved over time and become extremely complex and difficult to design, manufacture, debug, and repair. Also, although a single wire has only a small amount of copper, the weight from hundreds of wires is significant and impacts the performance of the aircraft. The copper wire connecting the sensor to the digital signal processing system additionally tends to acts as an antenna for undesirable electromagnetic radiation.

It would therefore be desirable to reduce the weight and provide immunity to radiation associated with conventional aircraft control embodiments.

Current sensing is an important component of power utility distribution systems for metering and monitoring of line currents. In these systems, the currents to be monitored are at very high voltage potentials with respect to ground. The conventional systems include a current transducer with significant insulation between the line potential and the near-ground potential of the control electronics. These transducers are costly, heavy, and sometimes result in system failures.

It would therefore be desirable to isolate a current sensor at line potential from the control electronics at earth potential without heavy and costly insulation.

BRIEF DESCRIPTION

Briefly, in accordance with one embodiment of the present invention, a micro piezo-optic composite transducer (MPCT) comprises: dielectric material; electrodes situated over opposing surfaces of the dielectric material; an optical fiber embedded in the dielectric material, the optical fiber configured to have a wavelength response as a function of material strain; and piezoelectric fibers embedded in the dielectric material and situated on opposing sides of the optical fiber.

In accordance with another embodiment of the present invention, a method for fabricating an MPCT comprises: positioning a first portion of dielectric material on a support surface, the first portion of dielectric material including at least one electrode coated thereon and facing towards the support surface; positioning an optical fiber configured to have a wavelength response as a function of material strain and piezoelectric fibers on the first portion of dielectric material with the piezoelectric fibers situated on opposing sides of the optical fiber; positioning a second portion of dielectric material over the optical fiber and piezoelectric fibers, the second portion of dielectric material including at least one electrode coated thereon and facing away from the support surface; and curing the first and second portions of dielectric material.

DRAWINGS

These and other features, aspects, and advantages of the present invention will become better understood when the following detailed description is read with reference to the accompanying drawings in which like characters represent like parts throughout the drawings, wherein:

FIG. 1 is a perspective view of a micro piezo-optic composite transducer (MPCT) illustrating an optical fiber within a composite comprising a dielectric material and piezoelectric fibers in accordance with one embodiment of the present invention.

FIG. 2 is a side view of an MPCT illustrating dielectric material with interdigitated electrodes.

DETAILED DESCRIPTION

Figure 3:
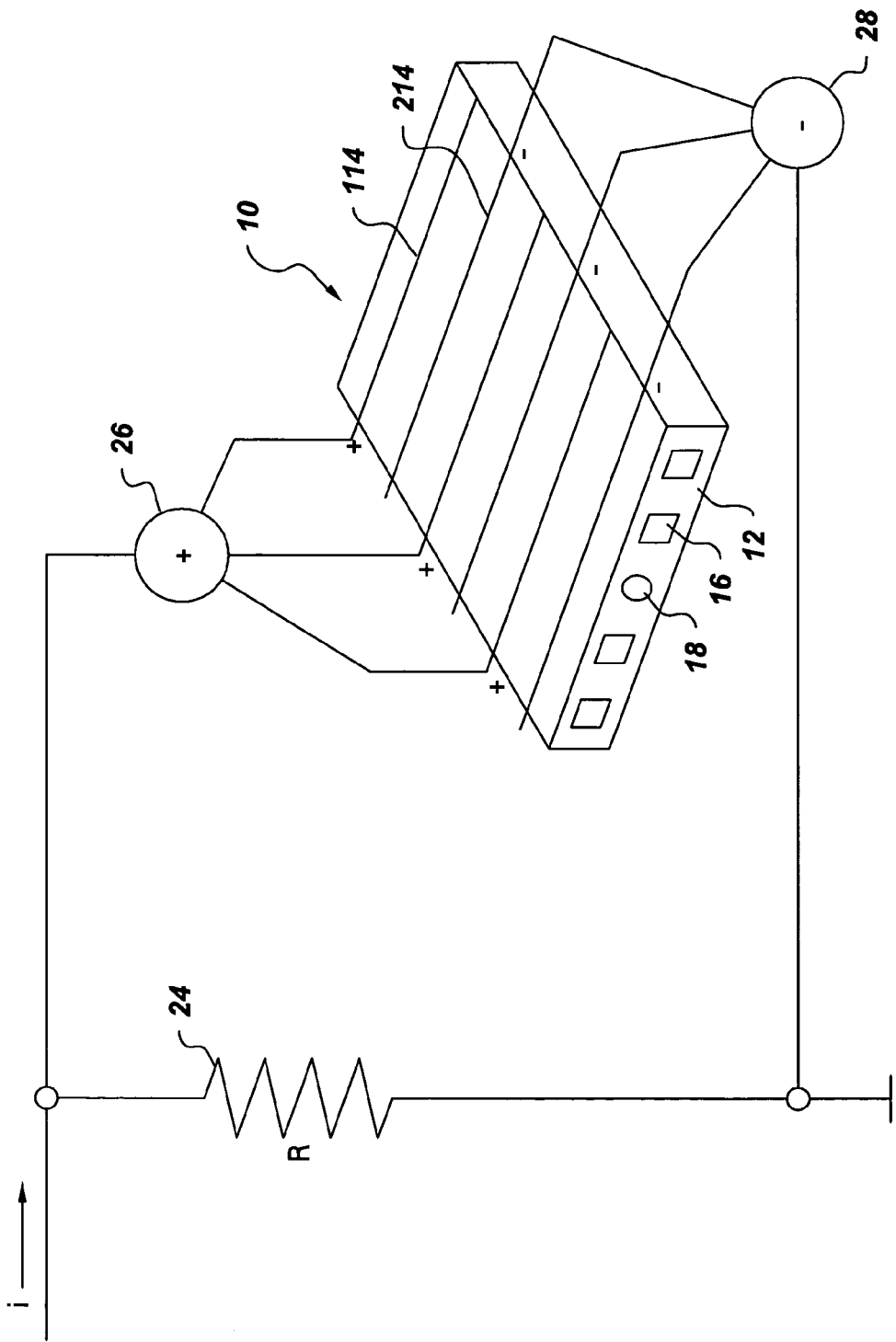
FIG. 3 is a schematic view of an optical sensor in accordance with one embodiment of the present invention.

Optical sensors are not limited by many of the weight and electromagnetic interference issues which impact copper based systems. Development of optical systems including optical sensors would be useful for aerospace and other complex structures for operation and health monitoring. Embodiments of the present invention relate to micro piezo-optic composite transducers (MPCTs).

More specifically, in one embodiment of the present invention, as shown in FIGS. 1–2, MPCT 10 comprises dielectric material 12; electrodes 14 situated over opposing surfaces of the dielectric material; optical fiber 18 embedded in the dielectric material, the optical fiber configured to have a wavelength response as a function of material strain; and piezoelectric fibers 20 embedded in the dielectric material and situated on opposing sides of the optical fiber. In FIG. 2, arrow 38 represents the direction of aligned in-plane strain and electric field.

Using embodiments of the present invention, a traditional current or voltage sensor connected by copper wires can be replaced by an optical current or voltage sensor comprising an MPCT 10. A voltage sensor embodiment, for example, is shown by voltage sensor 330 in FIG. 8. In a current sensor 30 (FIG. 3) embodiment, as another example which is described in further detail for purposes of illustration, to detect the signal, current to be monitored is passed through a resistor 24. This results in a voltage difference that is directly proportional to the current. The measured voltage is applied to MPCT 10. In an example embodiment, alternating positive and negative electrodes 114 and 214 are situated on MPCT 10 with positive electrodes 114 being coupled through connector 26 to the current-supplied side of resistor 24 and negative electrodes 214 being coupled through connector 28 to the ground side of resistor 24. In response to the applied voltage, the composite transducer deforms in proportion to the voltage. Strain induced in the optical fiber embedded in the MPCT results in a change in the transmitted and reflected light and occurs in proportion to the deformation of the MPCT. This in turn is proportional to the applied voltage that depends on the current to be measured. A processor 36 (shown in FIG. 8) can be used for monitoring the changes in light transmitted or reflected by the optical fiber and using the changes to obtain voltage or current signal information.

MPCTs have greater performance and are more rugged compared to other piezoelectric devices at lower cost. MPCTs consist of piezoelectric fibers embedded in a polymer matrix and encapsulated in a flexible package. A composite of piezoelectric fibers and polymer matrix is much stronger and more durable than a monolithic piezoelectric wafer.

Typical piezoelectric materials have directional piezoelectric properties that are stronger in one direction and weaker in the other two orthogonal directions as indicated by the directions indicated by numbers 1, 2, and 3 in FIG. 1. In conventional piezoelectric embodiments, electrodes typically cover the entire piezoelectric transducer surface, and the electric field occurs in direction 3 with resulting relevant strain due to the piezoelectric coupling along the 1 direction in accordance with the following example for PZT 5H piezoelectric material:

$$\epsilon_1 = d_{31} E_3$$

$$d_{31} = -274 \ p \ m/V$$

$$d_{33} = 593 \ p \ m/V$$

wherein $\epsilon_1$ represents the in-plane strain (with "in-plane" meaning direction of interest and "strain" meaning change in length relative to the original length), d represents the piezoelectric strain coefficient, E represents the electric field, p represents pico ($10^{-12}$), m represents distance, and V represents voltage.

By using interdigitated electrodes (meaning electrodes with alternating biases as shown in FIGS. 2–3) as described herein, the direction of the electric field can be shifted to direction 1 with resulting relevant piezoelectric coupling along direction 1 in accordance with the following example:

$$\epsilon_1 = d_{11} E_1$$

$$d_{13} = d_{31} = -274p \ m/V$$

$$d_{11} = d_{33} = 593 \ p \ m/V$$

In this example, the resultant in plane strain is increased by a factor of two indicating a substantially improved transducer performance compared to the previous example. Although interdigitated electrodes are advantageous, even non-interdigitated electrode embodiments (in combination with the embedded optical and piezoelectric fibers of the present invention) can offer benefits over conventional embodiments.

In a more specific aspect, the lengths of piezoelectric fibers 16 are substantially parallel with respect to the lengths of optical fiber 18 and substantially perpendicular with respect to interdigitated electrodes 14. This aspect is believed to be useful because optimal coupling is expected when the electric field of the electrodes is aligned with the strain and because positioning the optical fiber and the piezoelectric fibers along a common axis optimizes the strain transfer between the piezoelectric and the optic fibers and also prevents creasing of the optical fiber.

Figure 4:
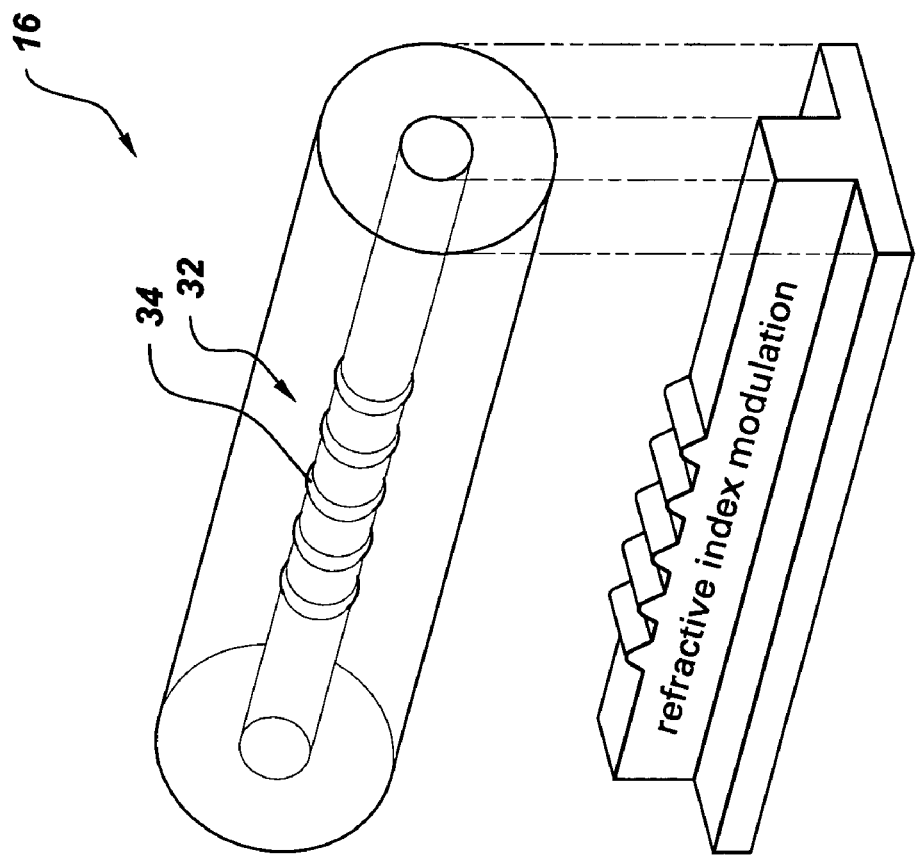
FIG. 4 is a perspective view of an example of a fiber including a Bragg grating.

In another more specific aspect, optical fiber 18 includes a grating 32. One non-limiting example of a grating is a Bragg grating. Another non-limiting example of a grating is a long period grating. An example illustration of a fiber including a Bragg grating is shown in FIG. 4. Typically a Bragg grating consists of refractive index modulation 34 along a portion of a fiber with a specified period. Fiber Bragg Gratings (FBGs) are based on the principle of Bragg reflection. When light propagates through periodically alternating regions of higher and lower refractive index, the light is partially reflected at each interface between those regions. A series of evenly spaced regions results in significant reflections at a single frequency while all other frequencies are transmitted. When a Bragg grating is used, the grating thus acts as a notch filter which reflects light of a certain wavelength. Since the frequency which is reflected is dependent on the grating period, a small change in the length of the fiber can be detected as a frequency shift. More specifically, strain induced in the fiber changes the grating period which alters the center frequency of the filter. Since the optical fiber is embedded in the piezo-optic composite transducer, the frequency shift in the reflected light is in proportion to the deformation of the MPCT. This in turn is proportional to the applied voltage that depends on the current to be measured. Therefore, the shift in wavelength of the light is proportional to the amount of current using the MPCT and optical fiber Bragg grating. Long period gratings are similar to fiber Bragg gratings in that a periodic change in refractive index is created in the fiber core. However, a long period grating has a period that is typically several orders of magnitude larger than the period of a fiber Bragg grating. The long period grating acts as a notch filter for transmitted light, with a wavelength response that can be modulated by applied voltage through the MPCT. One alternative to fiber gratings, for example, is a Fabry-Perot in-fiber sensor which reflects light strongly at several wavelengths. The pattern of reflected light is affected by the width of the Fabry-Perot cavity. This pattern can be modulated by applied voltage through the MPCT.

Piezoelectric fibers 16 are typically selected to be resistant to high temperatures such as temperatures up to about 200° C., for example. Typically piezoelectric fibers 16 comprise ceramic fibers or single crystal fibers, or combinations thereof, dielectric layer 12 comprises a polymer, and optical fiber 18 comprises glass. In a more specific example, dielectric layer 12 comprises a polyimide. In another embodiment, optical fiber 18 comprises a polymer. Although multiple piezoelectric fibers 16 are shown on each side of optical fiber 18 in FIG. 1, it is possible to have an embodiment with a single piezoelectric fiber on each side of the optical fiber. In such embodiments, the fibers are typically wider than those shown in FIG. 1. These embodiments do not provide as much crack propagation reduction as embodiments with multiple piezoelectric fibers 16 on each side of optical fiber 18.

Figure 5:
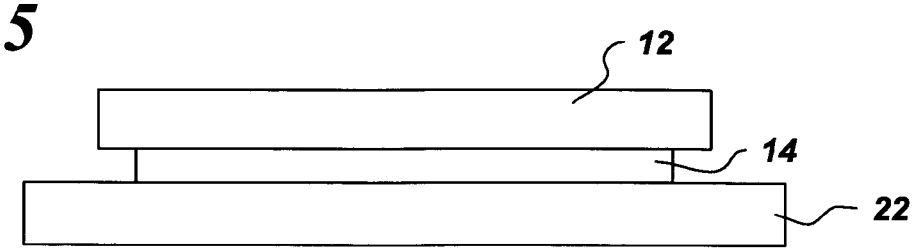
FIGS. 5–7 are sectional side views illustrating various phases of a fabrication process for the MPCT of FIG. 1.
Figure 6:
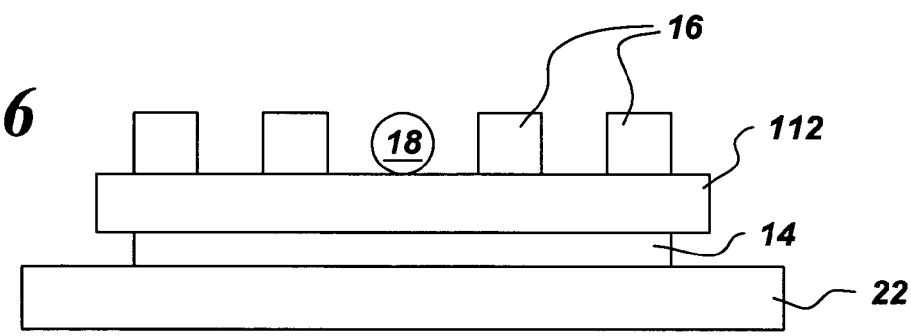
Figure 7:
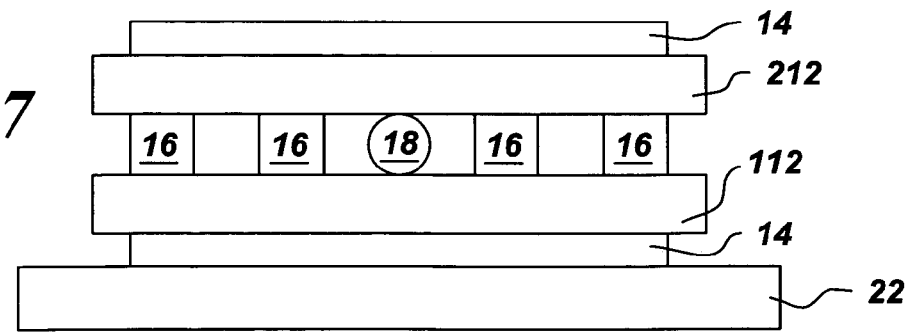

FIGS. 5–7 are sectional side views illustrating various phases of a fabrication process for the MPCT of FIG. 1. In this embodiment of the present invention, a method for fabricating MPCT 10 comprises: (a) positioning a first portion 112 of dielectric material 12 (FIG. 1) on a support surface 22, first portion 112 including interdigitated electrodes 14 coated thereon and facing towards support surface 22 (FIG. 5); (b) positioning optical fiber 18 configured to have a wavelength response as a function of material strain and piezoelectric fibers on first portion 112 with piezoelectric fibers 16 situated on opposing sides of optical fiber 18 (FIG. 6); (c) positioning a second portion 212 of dielectric material 12 over optical fiber 18 and piezoelectric fibers 16, second portion 212 including interdigitated electrodes 14 coated thereon and facing away from support surface 22 (FIG. 7); and (d) curing the first and second portions 112 and 212 of dielectric material 12 to obtain a structure similar to that described with respect to FIG. 1. In one specific, non-limiting example, curing occurs in a hot press at about 180° C. for about two hours at 100 psi. After packaging, the piezoelectric fibers are typically "polled" or "oriented" by applying a predetermined voltage thereacross.

In one aspect of the method, the positioning steps are performed in a manner so that the lengths of piezoelectric fibers 16 are substantially parallel with respect to the lengths of optical fiber 18 and substantially perpendicular were respect to interdigitated electrodes 14. In a more specific aspect wherein piezoelectric fibers 16 comprise ceramic, the step of positioning the fiber fibers comprises positioning a peizo ceramic wafer on a sticky membrane (not shown); removing a section of the wafer to provide clearance for the optical fiber; dicing the wafer into piezoelectric ceramic fibers; turning the wafer to face the first portion of dielectric material; releasing the peizo ceramic fibers from the sticky membrane; and positioning optical fiber. Lamination and packaging can be migrated to batch processing for lower cost. The materials and gratings discussed with respect to the transducer embodiment are equally applicable in this fabrication method embodiment.

The previously described embodiments of the present invention have many advantages, including using the composite material to arrest cracks 20 (FIG. 1) which may form in fibers by preventing the cracks to spread across the fibers and thus enhancing transducer durability. Another advantage is reduced sensitivity to environmental effects such as vibration since the fiber orientation, major piezoelectric axis and direction of interest are orthogonal to the direction of disturbance.

Figure 8:
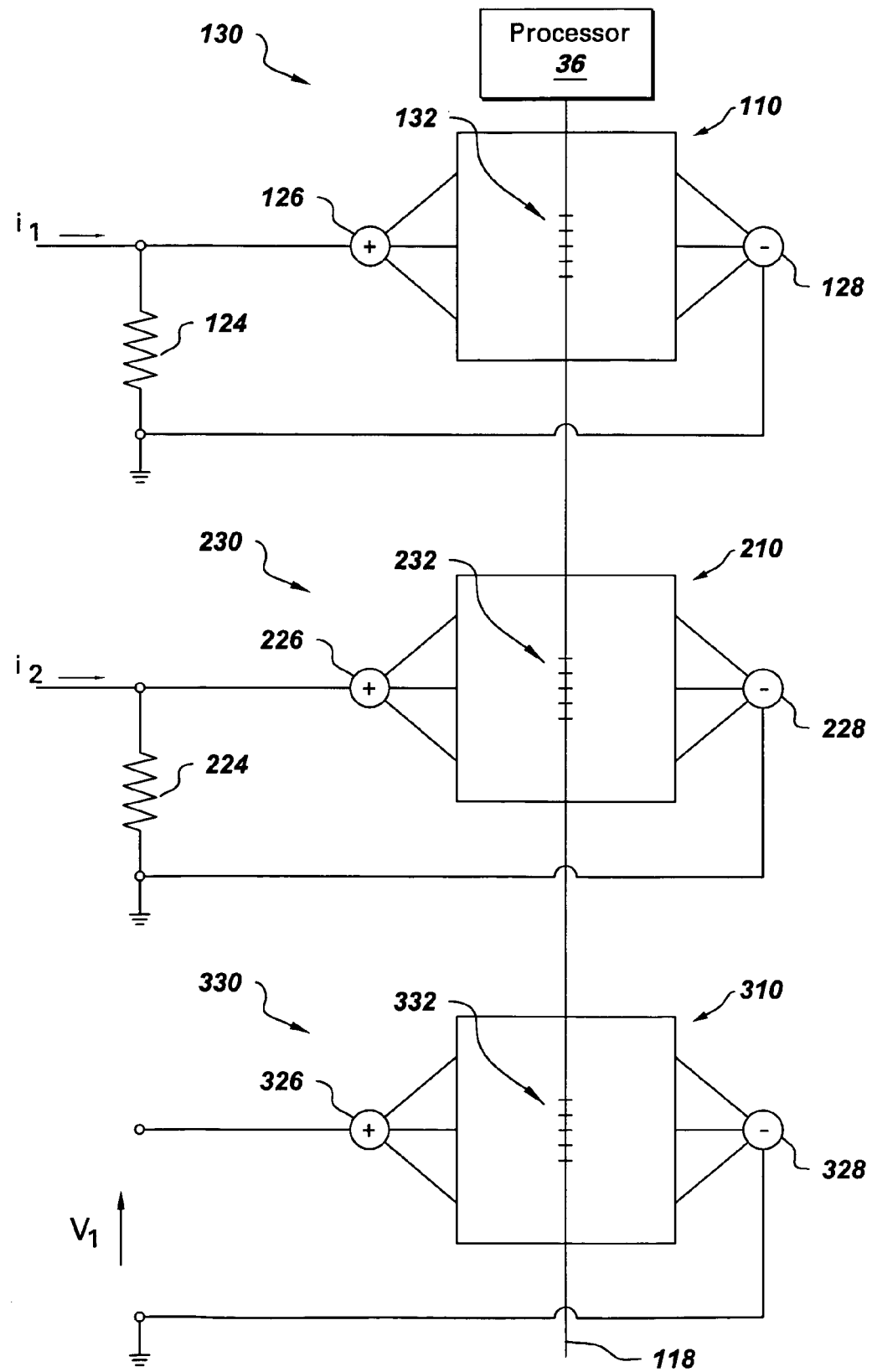
FIG. 8 is a schematic view of several optical sensors sharing a common fiber in accordance with another embodiment of the present invention.

Other advantages are weight savings and reduced overall complexity of the system due to the fact that a single optical fiber can carry output signal information from a plurality of sensors. This embodiment is illustrated for purposes of example in FIG. 8 wherein three optical sensors 130, 230, and 330 are shown as sharing a common optical fiber 118. Each sensor 130, 230, and 330 includes a respective resistor 124, 224, 324, MPCT 110, 210, 310 and connectors 126, 128, 226, 228, 326, 328. For ease of illustration, electrodes and piezoelectric fibers are not illustrated in FIG. 8. In a particularly useful single optical fiber/multiple sensor embodiment, the MPCTs each have a different type of Bragg grating. For example, as shown in FIG. 8, the refractive index modulation period of Bragg grating 232 is grater than that of Bragg grating 132 which in turn has period greater than that of Bragg grating 332. Different periods result in different center frequencies of the filters and provide for frequency multiplexing. In an embodiment which may be an alternative or used in combination with the frequency multiplexing embodiment, a time division multiplexing scheme could be used. A series of weak filters centered at the same frequency could be measured. In this embodiment, reflected or transmitted signals from the various filters could be resolved by observing the signals at different times. Since the gratings are separated in space on the same fiber, the time of arrival of reflected or transmitted signals will be different for each sensor. This embodiment has the additional advantage of not requiring fiber filters with different center frequencies for a multiplexed network of sensors.

Using an optical fiber configured to have a wavelength response as a function of material strain additionally provides benefits with respect to system compatibility. Typical optical current and voltage sensors rely on the faraday or Kerr effect to rotate the polarization state of an optical signal. Interrogating these sensors requires hardware specifically designed for this purpose. The optical fiber based current and voltage sensor described here can be interrogated with the same equipment used to interrogate fiber optic temperature and strain sensors. This equipment is more readily available and can multiplex temperature, strain, voltage, and current sensors on one fiber.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. A micro piezo-optic composite transducer comprising:
    dielectric material;
    electrodes situated over opposing surfaces of the dielectric material;
    an optical fiber embedded in the dielectric material, the optical fiber configured to have a wavelength response as a function of material strain;
    piezoelectric fibers embedded in the dielectric material and situated on opposing sides of the optical fiber.

2. The transducer of claim 1 wherein the electrodes comprise interdigitated electrodes and wherein at least two piezoelectric fibers are embedded on each opposing side of the optical fiber.

3. The transducer of claim 2 wherein the lengths of the piezoelectric fibers are substantially parallel with respect to the lengths of the optical fiber and substantially perpendicular with respect to the interdigitated electrodes.

4. The transducer of claim 3 wherein the optical fiber includes a Fabry-Perot cavity.

5. The transducer of claim 3 wherein the optical fiber includes a grating.

6. The transducer of claim 5 wherein the grating comprises a Bragg grating.

7. The transducer of claim 5 wherein the grating comprises a long period grating.

8. The transducer of claim 3 wherein the piezoelectric fibers are ceramic fibers or single crystal fibers.

9. The transducer of claim 3 wherein the dielectric layer comprises a polymer, the optical fiber comprises glass, and the piezoelectric fibers comprise fibers selected from the group consisting of ceramic fibers, single crystal fibers, or combinations therof.

10. The transducer of claim 3 wherein the optical fiber comprises a material selected from the group consisting of glass and polymer.

11. A micro piezo-optic composite transducer comprising:
    dielectric material;
    interdigitated electrodes situated over opposing surfaces of the dielectric material;
    an optical fiber embedded in the dielectric material, the optical fiber including a Bragg grating and configured to have a wavelength response as a function of material strain;
    piezoelectric fibers embedded in the dielectric material and situated on opposing sides of the optical fiber, wherein the lengths of the piezoelectric fibers are substantially parallel with respect to the lengths of the optical fiber and substantially perpendicular with respect to the interdigitated electrodes.

12. The transducer of claim 11 wherein the dielectric layer comprises a polymer, the optical fiber comprises glass, and the piezoelectric fibers comprise fibers selected from the group consisting of ceramic fibers, single crystal fibers, or combinations thereof.

13. A sensing system comprising:
a micro piezo-optic composite transducer comprising: dielectric material, electrodes situated over opposing surfaces of the dielectric material, an optical fiber embedded in the dielectric material, the optical fiber configured to have a wavelength response as a function of material strain, and piezoelectric fibers embedded in the dielectric material and situated on opposing sides of the optical fiber, selected ones of the electrodes being coupled to selected ends of the resistor;
a processor for monitoring changes in light transmitted or reflected by the optical fiber and using the changes to obtain signal information, wherein the signal information comprises signal information selected from the group consisting of current information, voltage information, and combinations thereof.

14. The sensing system of claim 11 further comprising a resistor, wherein the micro piezo-optic composite transducer is electrically coupled to the resistor.

15. The sensing system of claim 11 wherein the electrodes comprise interdigitated electrodes and wherein at least two piezoelectric fibers are embedded on each opposing side of the optical fiber.

16. The sensing system of claim 15 wherein the lengths of the piezoelectric fibers are substantially parallel with respect to the lengths of the optical fiber and substantially perpendicular with respect to the interdigitated electrodes.

17. The sensing system of claim 16 wherein the optical fiber includes a Fabry-Perot cavity.

18. The sensing system of claim 16 wherein the optical fiber includes a grating.

19. The sensing system of claim 18 wherein the grating comprises a Bragg grating.

20. The sensing system of claim 18 wherein the grating comprises a long period grating.

21. The sensing system of claim 16 wherein the piezoelectric fibers are ceramic fibers or single crystal fibers.

22. The sensing system of claim 16 wherein the dielectric layer comprises a polymer, the optical fiber comprises glass, and the piezoelectric fibers comprise fibers selected from the group consisting of ceramic fibers, single crystal fibers, or combinations thereof.

23. The sensing system of claim 13 wherein the micro piezo-optic composite transducer comprises a plurality of micro piezo-optic composite transducers, each micro piezo-optic composite transducer including the optical fiber.

24. The sensing system of claim 23 wherein the electrodes comprise interdigitated electrodes and wherein at least two piezoelectric fibers are embedded on each opposing side of the optical fiber.

25. The sensing system of claim 24 wherein the optical fiber includes at least one Bragg grating situated in at least one of the micro piezo-optic composite transducers.

26. The sensing system of claim 24 wherein the optical fiber includes a plurality of Bragg gratings, each situated in respective ones of the micro piezo-optic composite transducers.

27. The sensing system of claim 26 wherein at least two of the plurality of Bragg gratings have different modulation refractive index periods.

28. A sensing system comprising:
an optical fiber;
a plurality of micro piezo-optic composite transducers each comprising: dielectric material, interdigitated electrodes situated over opposing surfaces of the dielectric material, the optical fiber embedded in the dielectric material and configured to have a wavelength response as a function of material strain, and piezoelectric fibers embedded in the dielectric material and situated on opposing sides of the optical fiber;
a processor for monitoring changes in light transmitted or reflected by the optical fiber and using the changes to obtain signal information from the plurality of micro piezo-optic composite transducers, wherein the signal information comprises signal information selected from the group consisting of current information, voltage information, and combinations thereof.

29. The sensing system of claim 28 wherein the lengths of the piezoelectric fibers are substantially parallel with respect to the lengths of the optical fiber and substantially perpendicular with respect to the interdigitated electrodes.

30. The sensing system of claim 29 wherein the piezoelectric fibers are ceramic fibers or single crystal fibers.

31. The sensing system of claim 29 wherein the optical fiber includes a Fabry-Perot cavity.

32. The sensing system of claim 29 wherein the optical fiber includes at least one grating situated in at least one of the micro piezo-optic composite transducers.

33. The sensing system of claim 32 wherein the at least one grating comprises a Bragg grating, a long period grating, or combinations thereof.

34. The sensing system of claim 29 wherein the optical fiber includes a plurality of Bragg gratings, each situated in a respective one of the micro piezo-optic composite transducers.

35. The sensing system of claim 34 wherein at least two of the plurality of Bragg gratings have different modulation refractive index periods.

* * * * *

UNITED STATES PATENT AND TRADEMARK OFFICE
CERTIFICATE OF CORRECTION

PATENT NO. : 7,030,366 B2  
APPLICATION NO. : 10/847953  
DATED : April 18, 2006  
INVENTOR(S) : Charles Erklin Seeley et al.

It is certified that error appears in the above-identified patent and that said Letters Patent is hereby corrected as shown below:

Column 7, line 25, "claim 11", should read --claim 13--.

Column 7, line 28, "claim 11", should read --claim 13--.

Signed and Sealed this

First Day of August, 2006

JON W. DUDAS  
*Director of the United States Patent and Trademark Office*